(12) United States Patent
Kawazu

(10) Patent No.: US 7,741,674 B2
(45) Date of Patent: Jun. 22, 2010

(54) NON-VOLATILE MEMORY WITH SOURCE/DRAINS IN MULTIPLE DIRECTIONS

(75) Inventor: Yoshiyuki Kawazu, Saitama (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 102 days.

(21) Appl. No.: 11/819,216

(22) Filed: Jun. 26, 2007

(65) Prior Publication Data

US 2008/0017919 A1     Jan. 24, 2008

(30) Foreign Application Priority Data

Jul. 18, 2006    (JP) .............................. 2006-195070

(51) Int. Cl.
  *H01L 29/792*    (2006.01)
(52) U.S. Cl. .................. 257/326; 257/314; 257/320; 257/E29.309
(58) Field of Classification Search ................ 257/324, 257/E29.309, 314, 320, 326, E29.12
See application file for complete search history.

(56) References Cited

U.S. PATENT DOCUMENTS

2003/0011007 A1*  1/2003  Takashino ................... 257/202
2005/0199912 A1*  9/2005  Hofmann et al. ............ 257/204

FOREIGN PATENT DOCUMENTS

JP        2001-512290          8/2001

* cited by examiner

*Primary Examiner*—Lynne A Gurley
*Assistant Examiner*—Vernon P Webb
(74) *Attorney, Agent, or Firm*—Rabin & Berdo, PC

(57) ABSTRACT

An object is to improve a data recording amount per memory cell. In the invention, in a non-volatile memory, the data contents of which can be electrically written and erased, each memory cell that configures the non-volatile memory is provided with: source/drain regions formed on a semiconductor substrate; a gate electrode formed on a channel region of the semiconductor substrate; and a gate insulating film formed between the semiconductor substrate and the gate electrode. A configuration in which the source/drain regions extend at least in three directions from the channel region when seen on a plane from the gate electrode side is employed.

9 Claims, 10 Drawing Sheets

Cell

FIG. 6

| Read-Bit | Voltage | | | | Gate Electrode |
|---|---|---|---|---|---|
| | 24a | 24b | 23a | 23b | |
| 29a | 0V | Floating | 5V | Floating | 3V |
| 29b | 5V | Floating | 0V | Floating | 3V |
| 29a' | Floating | 0V | Floating | 5V | 3V |
| 29b' | Floating | 5V | Floating | 0V | 3V |

FIG. 8

| Read-Bit | Voltage | | | Gate Electrode |
|---|---|---|---|---|
| | 34a | 34b | 34c | |
| 39a | 0V | Floating | 5V | 3V |
| 39b | 5V | 0V | Floating | 3V |
| 39c | Floating | 5V | 0V | 3V |

FIG. 10

| Read-Bit | Voltage | | | | | | Gate Electrode |
| --- | --- | --- | --- | --- | --- | --- | --- |
| | 44a | 44b | 44c | 44d | 44e | 44f | |
| 49a | 0V | Floating | Floating | Floating | Floating | 5V | 3V |
| 49b | Floating | 0V | Floating | Floating | 5V | Floating | 3V |
| 49c | Floating | Floating | 0V | 5V | Floating | Floating | 3V |
| 49d | Floating | Floating | 5V | 0V | Floating | Floating | 3V |
| 49e | Floating | 5V | Floating | Floating | 0V | Floating | 3V |
| 49f | 5V | Floating | Floating | Floating | Floating | 0V | 3V |

//

NON-VOLATILE MEMORY WITH SOURCE/DRAINS IN MULTIPLE DIRECTIONS

CROSS REFERENCE TO RELATED APPLICATION

This application claims the priority of Application No. 2006-195070, filed Jul. 18, 2006 in Japan, the subject matter of which is incorporated herein by reference.

TECHNICAL FIELD OF THE INVENTION

The present invention relates to a non-volatile semiconductor memory from which contained data can be electrically erased.

BACKGROUND OF THE INVENTION

A flash memory is a typical example of a non-volatile semiconductor memory. Data can be freely written in and erased from a flash memory and the data content is not erased even when power supply is cut. This flash memory offers the advantages, of both RAM (Random Access Memory) and ROM (Read Only Memory). For this reason, recently, flash memory is used packaged in a card form as a memory card in a recording medium of a mobile phone, a digital camera, a portable music player and so forth.

In such a flash memory, a memory able to store two bits of information in a single memory cell has been considered in order to improve the level of integration of the flash memory. For example, in Japanese Translation of PCT International Application, Publication No. 2001-512290, an EEPROM (Electrical Erasable Programmable Read Only Memory), which is a programmable read-only memory, is disclosed.

FIG. 1 and FIG. 2 show a configuration of a memory cell disclosed in Japanese Translation of PCT International Application, Publication No. 2001-512290. FIG. 2 shows a sectional surface along the line A-A' of FIG. 1. On a semiconductor substrate 11, there is provided an active region 12 configured with a boron-doped P-type semiconductor for example. On this active region 12, there are provided a drain 13 and a source 14 fabricated from a phosphorous-doped N-type semiconductor on both sides of a channel 15 for example. On the channel 15 there is formed a three-layered electric charge capturing film 16 for accumulating electric charges. This electric charge capturing film 16 comprises an insulting film 16a in contact with the channel, an insulating film 16c in contact with a gate electrode 17, and a non-conductive electric charge capturing film 16b, held between these insulating films. For reading and writing data, pin contacts 18 are respectively connected to the drain 13 and the source 14.

The non-conductive electric charge capturing film 16b forms one of bits 19a and 19b in a region in the proximity of the drain 13 or in a region in the proximity of the source 14. In FIG. 2, when a voltage is applied from the source 14 to the drain 13 to carry out writing, hot electrons (free electrons) enter the non-conductive electric charge capturing film 16b of the region of the bit 19b, and the information is recorded. On the other hand, when a voltage is applied from the drain 13 to the source 14 to carry out writing, hot electrons enter the non-conductive electric charge capturing film 16b of the region of the bit 19a, and the information (bit data) is recorded. If a voltage is not applied when writing, hot electrons are not captured. In this way, bit information of "0" and "1" are recorded.

When reading bit information, a voltage is applied in the direction opposite to writing. For example, when reading the information stored in the region of the bit 19a, a voltage is applied from the source 14 to the drain 13. When an electric charge is captured electric current does not flow, and when an electric charge is not captured, electric current flows. Therefore, the bit information can be read. By reversing the writing direction and the reading direction, a single memory cell can hold two bits of data.

However, despite the fact that a single memory cell has become able to record two bits of data and a flash memory has become common, there is still a demand for miniaturization and cost reduction in a flash memory. Accordingly, there is a strong demand for improving the level of integration.

OBJECTS OF THE INVENTION

Accordingly, an object of the present invention is to provide a non-volatile memory able to improve a recording data amount per memory cell.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In order to solve the above problems, in the present invention, in a non-volatile memory, the data contents of which can be electrically written and erased, each memory cell that configures the non-volatile memory is provided with: source/drain regions formed on a semiconductor substrate; a gate electrode formed on a channel region of the semiconductor substrate; and a gate insulating film formed between the semiconductor substrate and the gate electrode. A configuration in which the source/drain regions extend at least in three directions from the channel region when seen on a plane from the gate electrode side is employed.

The gate insulating film may be configured with first and second insulating film layers and a dielectric layer formed between these insulating film layers. In the non-volatile memory of the present invention, bit information is held in the proximity of the source/drain regions in the gate insulating film.

In the present invention, "on" or "above" refer to a direction of accumulating an insulating film, a dielectric layer, or an electrode on a semiconductor substrate. Specifically, the direction of the arrow shown in FIG. 4 is the upward direction.

When reading data from the memory cell configured as described above, a difference in electric potential is given to one of the source/drain regions, and the other region is in a floating state. By detecting the electric current between the electrodes to which the potential difference has been applied, bit information of the relevant bit can be read. Preferably, the voltage to be applied to the gate electrode is set to a value between the voltages to be applied to the source/drain regions. By having such electric potential setting, multi-valued bit information stored in a single charge storage region (gate insulating film) can be read.

According to the present invention having a configuration described above, a data recording amount per memory cell (the level of integration) can be improved. As a result, a

BRIEF DESCRIPTION OF THE DRAWINGS

FIG. 6 is a table showing an example of voltage (electric potential) application conditions for reading bit data in the memory cell according to the first embodiment of the present invention.

FIG. 8 is a table showing an example of voltage (electric potential) application conditions for reading bit data in the memory cell according to the second embodiment of the present invention.

FIG. 10 is a table showing an example of voltage (electric potential) application conditions for reading bit data in the memory cell according to the third embodiment of the present invention.

DESCRIPTION OF THE REFERENCE SYMBOLS

21: Semiconductor substrate
22: First semiconductor region
23$a$, 23$b$, 24$a$, 24$b$: Source/drain region
34$a$, 34$b$, 34$c$: Source/drain region
44$a$, 44$b$, 44$c$, 44$d$, 44$e$, 44$f$: Source/drain region
29$a$, 29$a'$, 29$b$, 29$b'$: Bit
39$a$, 39$b$, 39$c$: Bit
49$a$, 49$b$, 49$c$, 49$d$, 49$e$, 49$f$: Bit
17, 27: Gate electrode

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
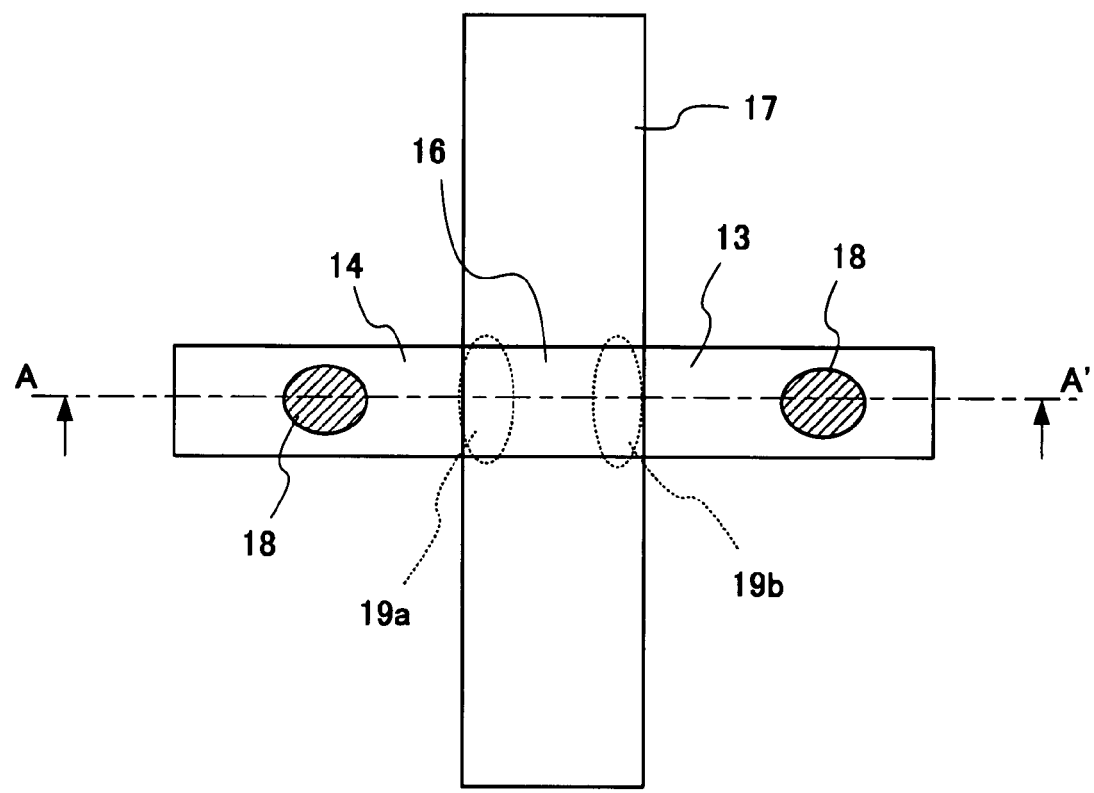
FIG. 1 is a plan view of a conventional memory cell seen from above the memory cell.
Figure 2:
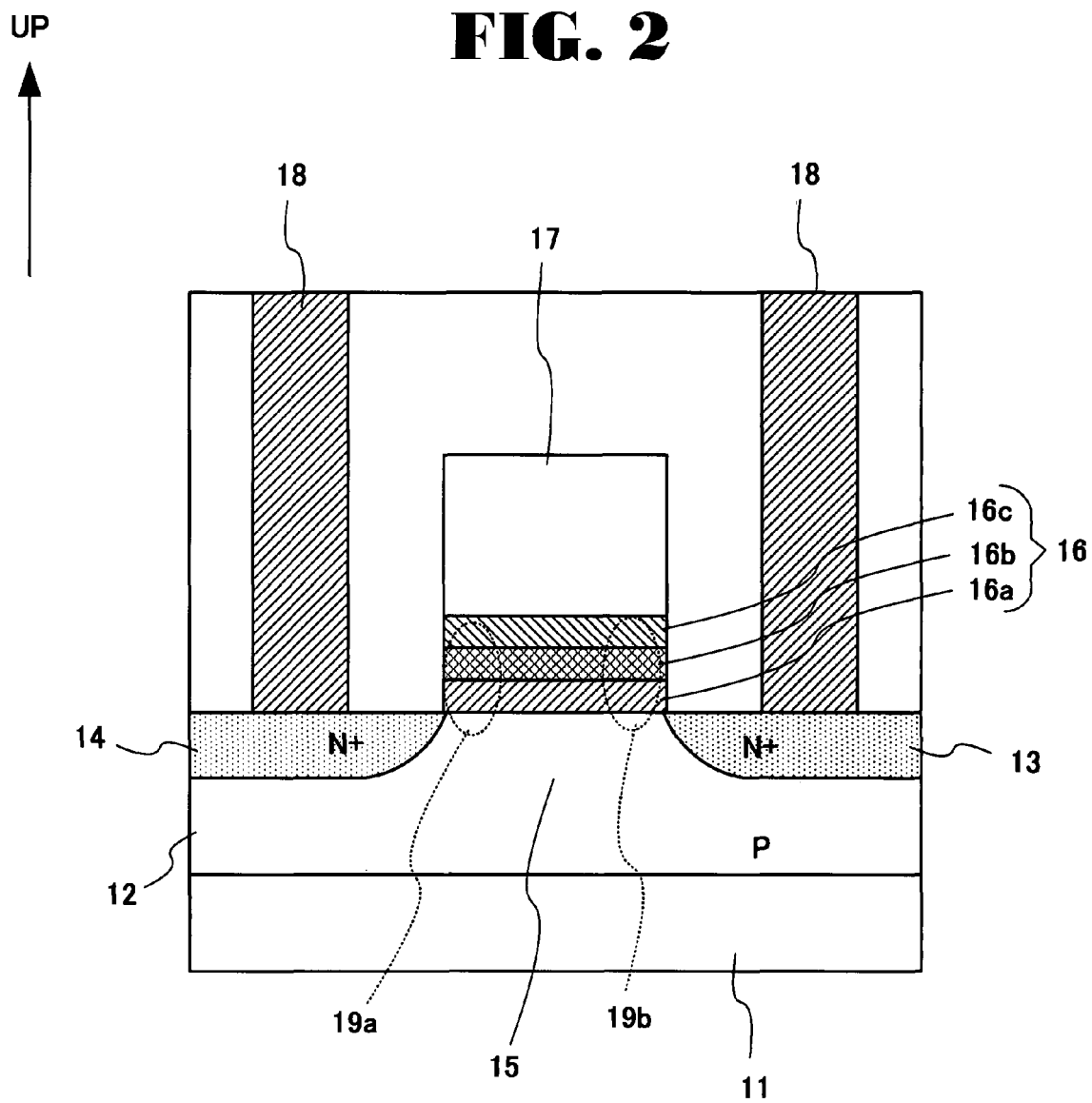
FIG. 2 is a sectional view showing a sectional surface along the line A-A' of FIG. 1.
Figure 3:
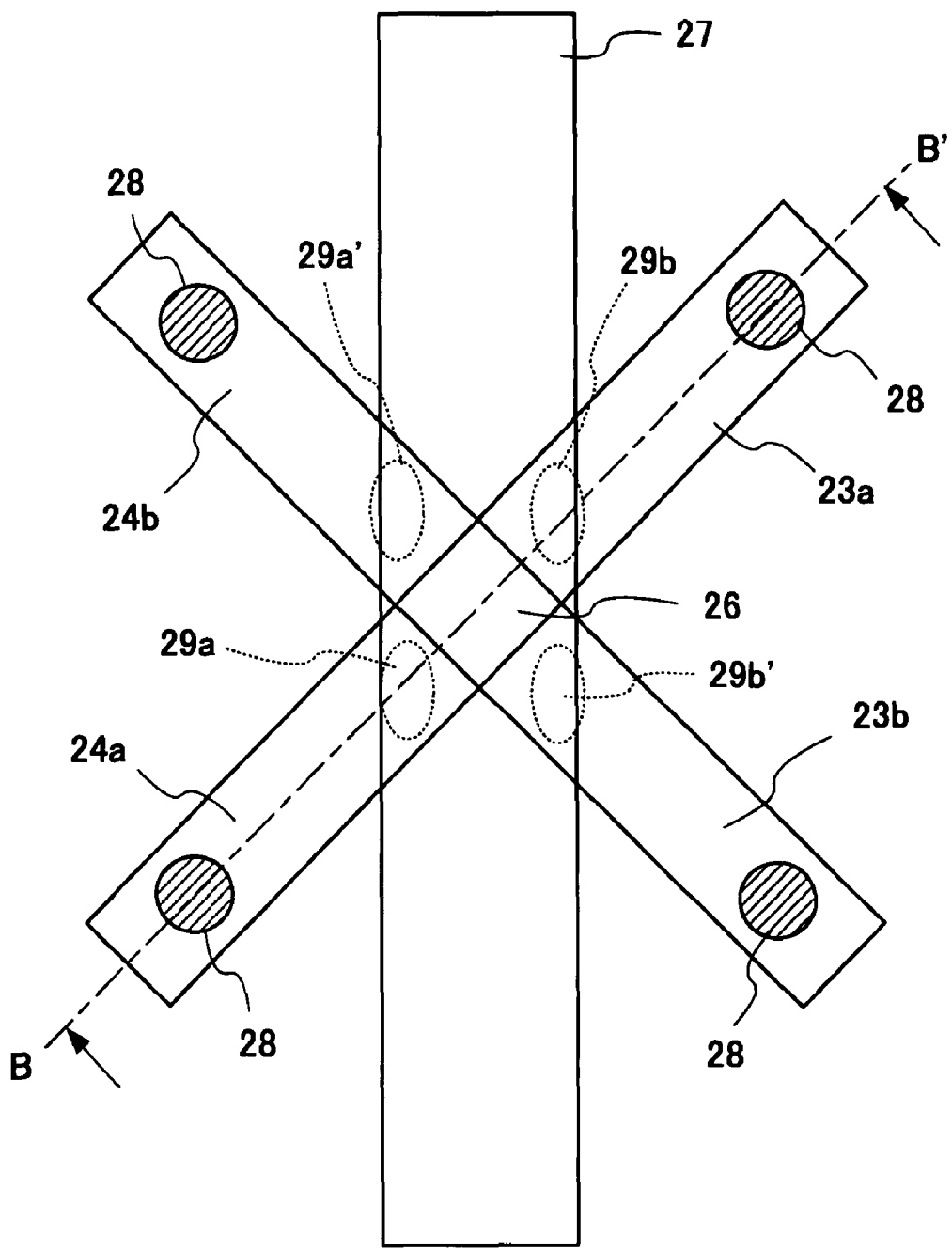
FIG. 3 is a plan view of a memory cell according to a first embodiment of the present invention seen from above the memory cell.
Figure 4:
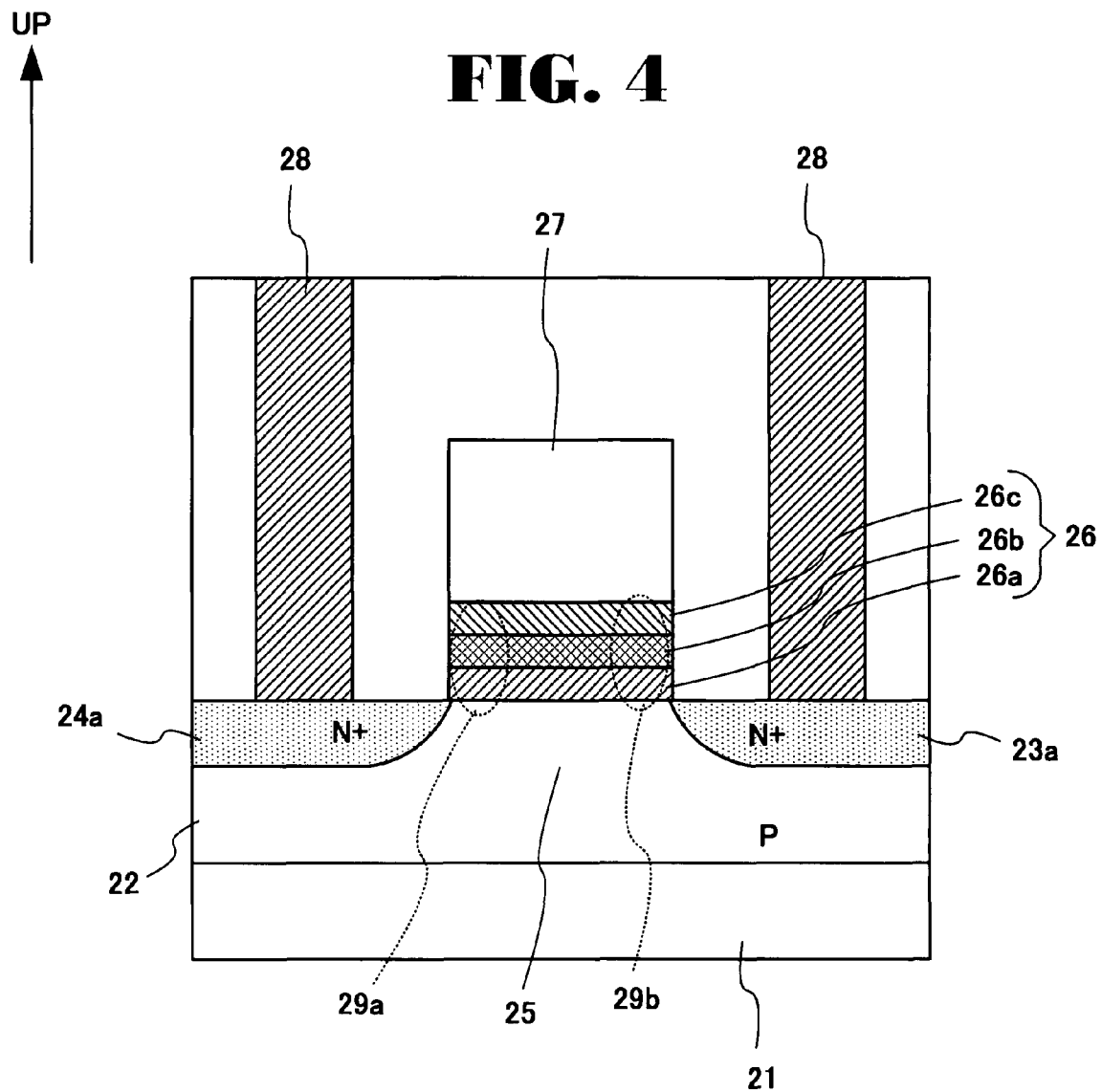
FIG. 4 is a sectional view showing a sectional surface along the line B-B' of FIG. 3.
Figure 5:
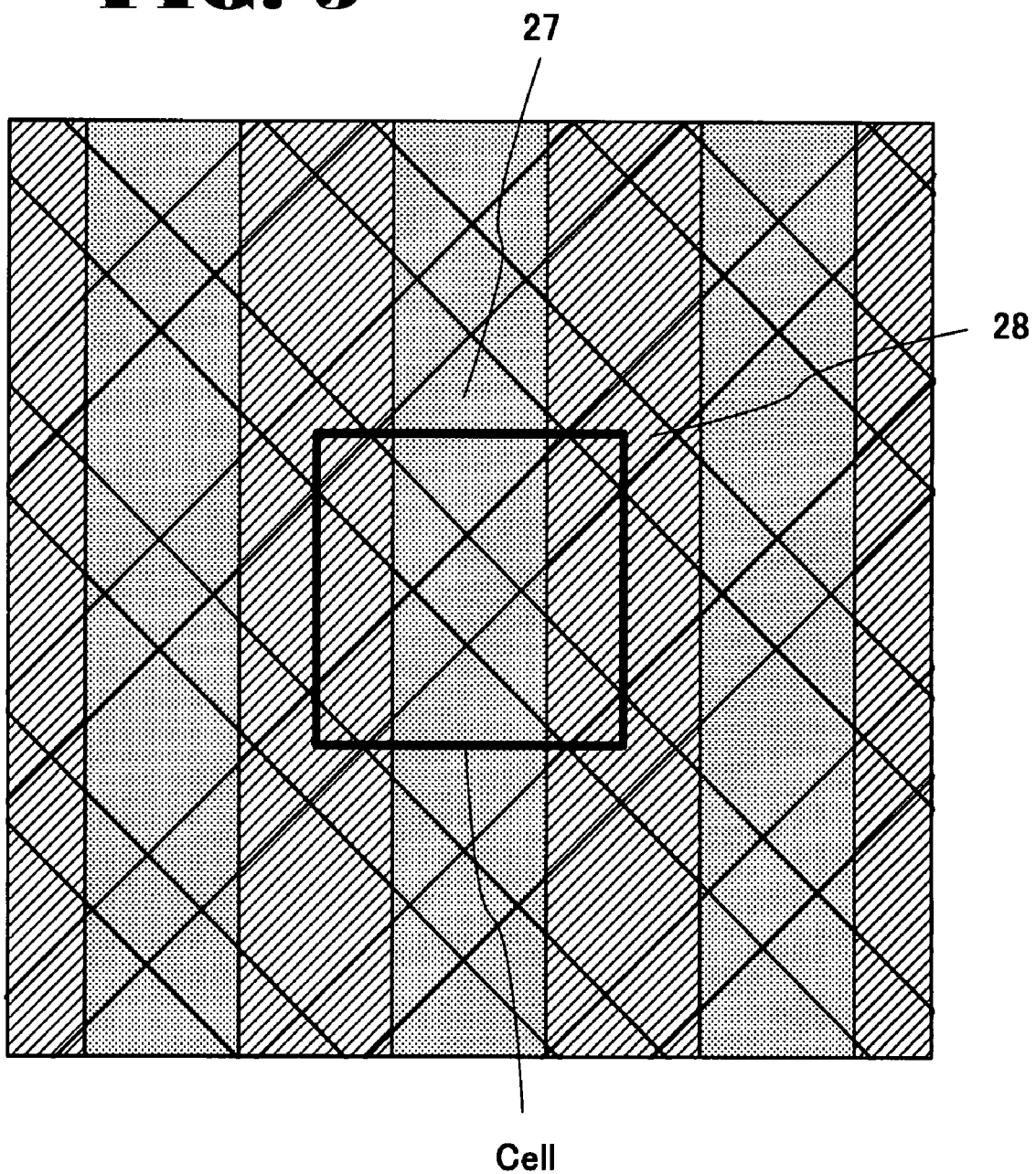
FIG. 5 is a layout drawing showing a memory cell array of a non-volatile memory according to the first embodiment of the present invention.

FIG. 3 and FIG. 4 show a structure of a memory cell that constructs a non-volatile memory according to a first embodiment of the present invention. FIG. 4 shows a sectional structure in the direction B-B' of FIG. 3. FIG. 5 shows a layout of a memory cell array according to the present embodiment, wherein the heavy lined square denotes the memory cell.

In the non-volatile memory of the present embodiment, on a semiconductor substrate 21 there is provided an active region 22 configured with a first semiconductor region (boron-doped P-type semiconductor). On this active region 22, there are provided source/drain regions 23$a$ and 24$a$ made from a second semiconductor (phosphorous-doped N-type semiconductor) on both sides of a channel region 25. In the present embodiment, as shown in FIG. 3, one and the other of the source/drain regions 23$a$ and 24$a$ extend in a straight line, forming a pair. Two pairs (23$a$: 24$a$, 23$b$: 24$b$) are formed so as to be orthogonal to each other when seen from above the semiconductor substrate 21.

On the channel region 25 there is formed a three-layered charge storage region 26 for storing electric charges between the channel region 25 and a gate electrode 27. Polysilicon is used for the gate electrode 27. This charge storage region 26 is configured with an insulating film 26$a$ in contact with the channel region 25, an insulating film 26$c$ in contact with the gate electrode 27, and a dielectric film 26$b$ that is held between these insulating films. The insulating films 26$a$ and 26$c$ are formed from a silicon oxide film. The dielectric film 26$b$ is formed from a silicon nitride film. For reading and writing data, pin contacts 28 are respectively connected to the drains (23$a$, 23$b$) and to the sources (24$a$, 24$b$).

In the dielectric film 26$b$, in the charge storage region 26 in the proximity of the drain 23$a$ and the source 24$a$, there is formed a pair of bits 29$a$ and 29$b$. When a voltage is applied from the source 24$a$ to the drain 23$a$ to carry out writing, hot electrons enter the region of the dielectric film 26$b$ of the bit 29$b$, and the information is recorded. On the other hand, when a voltage is applied from the drain 23$a$ to the source 24$a$ to carry out writing, hot electrons enter the region of the dielectric film 26$b$ of the bit 29$a$, and the information is recorded.

If a voltage is not applied when writing, hot electrons do not enter. In this way, bit information of "0" and "1" are recorded. That is to say, information of two bits is recorded in the pair of second semiconductor regions.

Similarly, in the dielectric film 26$b$, in the region in the proximity of the drain 23$b$ and the source 24$b$, there are formed two bits 29$a'$ and 29$b'$ on which bit information is respectively recorded. Accordingly, in the channel region 25 of a single memory cell, the state of two raised to the power of four (=16), that is to say, information of four bits are recorded.

When reading bit information, a voltage is applied in the direction opposite to writing. At this time, an electric potential between the two voltages applied is applied to the gate electrode 27. For example, in the case of reading bit information of 29$a$, 0 (V) is applied to the source 24$a$, 5 (V) is applied to the drain 23$a$, and 3 (V) is applied to the gate electrode 27. Moreover, the remaining second semiconductor regions 24$b$ and 23$b$ are in a floating state.

As a result, when electric charge is captured electric current does not flow, and when electric charge is not captured electric current flows, and the bit information of the bit 29$a$ can be read. The bit information is "0" when electric charge (electrons) is present in the bit, and the bit information is "1" when electric charge (electrons) is not present in the bit. FIG. 6 shows an example of the potentials to be applied to the respective electrodes when reading information of the respective bits.

As described above, according to the first embodiment, an information amount that can be stored in a single memory cell can be increased to four bits and a cost reduction resulting from reducing the chip area is possible.

Figure 7:
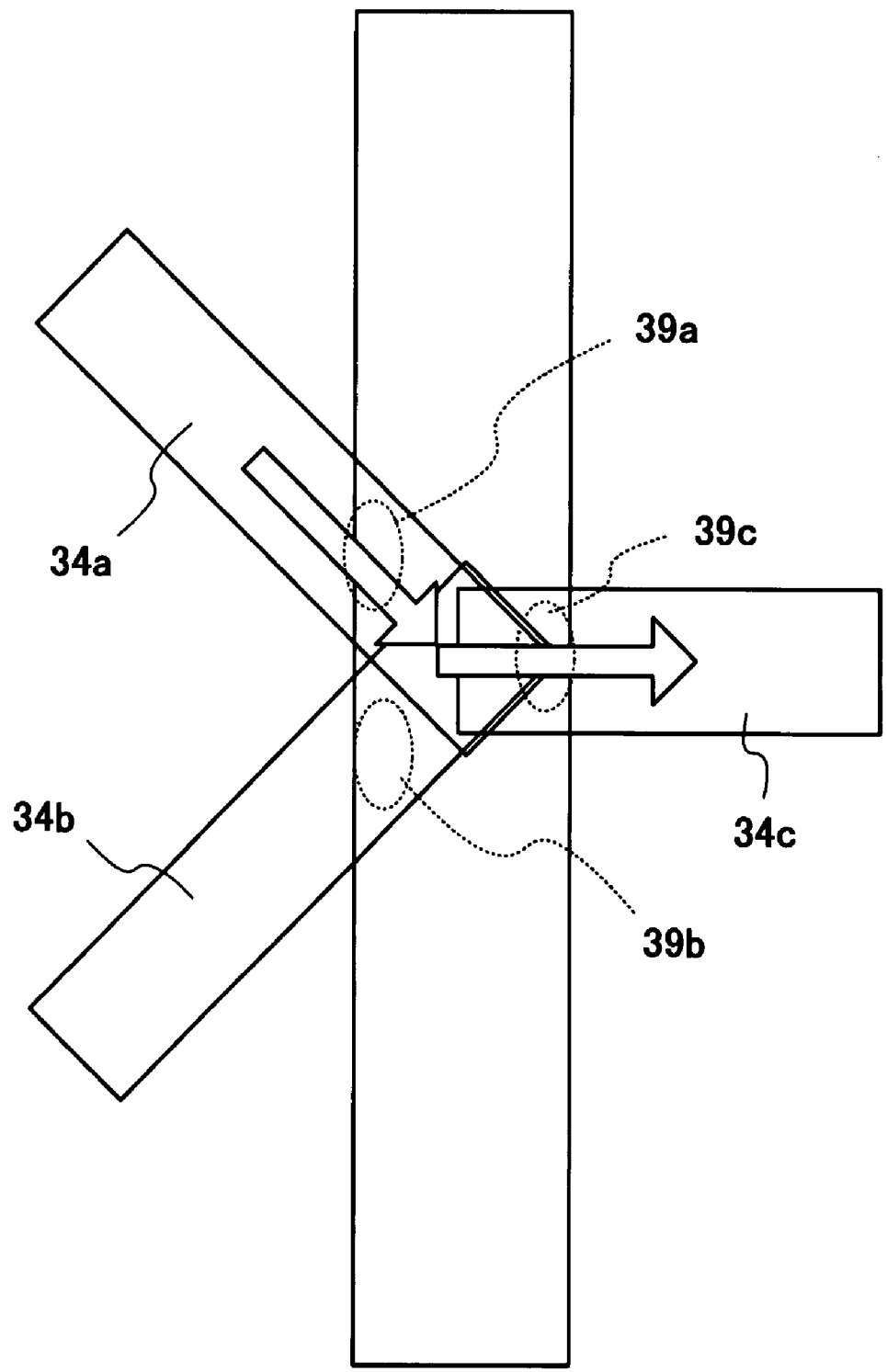
FIG. 7 is a plan view of a memory cell according to a second embodiment of the present invention seen from above the memory cell.

FIG. 7 shows a structure of a memory cell that constructs a non-volatile memory according to a second embodiment of the present invention. In the present embodiment, descriptions of components similar to those in the first embodiment are omitted. The present embodiment is configured such that one drain (for example, 34c) and two sources (for example, 34a and 34b) extend in three directions toward the charge storage regions on the channel region.

The dielectric film in the charge storage region has three bits 39a, 39b, and 39c respectively formed in regions in the proximity of the drain 34c and the sources 34a and 34b.

When a voltage is applied from the source 34a to the drain 34c to carry out writing, hot electrons enter the region of the dielectric film of the bit 39c, and the information is recorded. On the other hand, when a voltage is applied in the opposite direction from the drain 34c to the source 34a to carry out writing, hot electrons enter the region of the dielectric film of the bit 39a, and the information is recorded. If a voltage is not applied when writing, hot electrons do not enter. In this way, bit information of "0" and "1" are recorded.

Similarly, in the dielectric film, in the region in the proximity of the source 34b, there is formed a single bit 39a to record bit information therein. Writing into this source 34b is possible when a voltage is applied from either one of the source 34a or drain 34c. Accordingly, in the channel region of a single memory cell, the state of two raised to the power of three (=8), that is to say, information of three bits are recorded.

When reading bit information, a voltage is applied in the direction opposite to writing. At this time, an electric potential between the two voltages applied to the source/drain is applied to the gate electrode. For example, in the case of reading bit information of 39a, 0 (V) is applied to the source 34a, 5 (V) is applied to the drain 34c, and 3 (V) is applied to the gate electrode. Moreover, the remaining source/drain regions 34b are in a floating state. As a result, when electric charge is captured electric current does not flow, and when electric charge is not captured electric current flows, and the bit information of the bit 39a can be read. FIG. 8 shows an example of the potentials to be applied to the respective electrodes when reading information of the respective bits.

As described above, according to the second embodiment, an information amount that can be stored in a single memory cell can be increased to three bits and a cost reduction resulting from reducing the chip area is possible.

Figure 9:
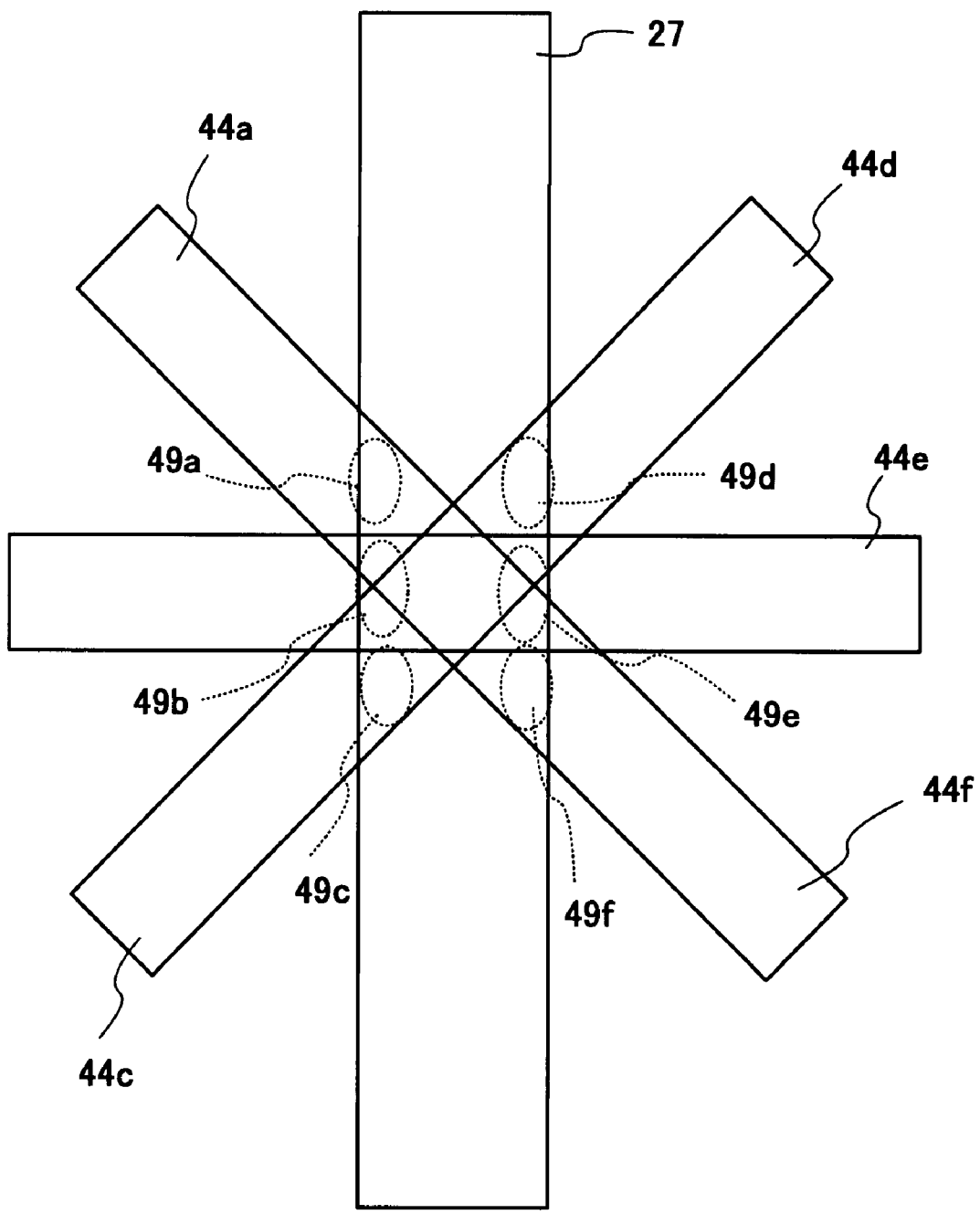
FIG. 9 is a plan view of a memory cell according to a third embodiment of the present invention seen from above the memory cell.

FIG. 9 shows a structure of a memory cell that constructs a non-volatile memory according to a third embodiment of the present invention. In the present embodiment, descriptions of components similar to those in the first embodiment and second embodiment are omitted. In the present embodiment, one drain (for example, 44f) and one source (for example, 44a) are arranged in a straight line form, forming a pair. Impurity diffusion regions (44a, 44b, 44c, 44d, 44e, 44f) are formed so that three pairs become symmetric about the gate electrode when seen from above the semiconductor substrate.

In the dielectric film, for example, in the respective regions in the proximity of the drain 44f and the source 44a there is formed a pair of bits 49a and 49f. When a voltage is applied from the source 44a to the drain 44f to carry out writing, hot electrons enter the region of the dielectric film of the bit 49f, and the information is recorded. On the other hand, when a voltage is applied in the opposite direction from the drain 44f to the source 44a to carry out writing, hot electrons enter the region of the dielectric film of the bit 49a, and the information is recorded. If a voltage is not applied when writing, hot electrons do not enter. In this way, bit information of "0" and "1" are recorded. That is to say, information of two bits is recorded in the pair of source/drain regions.

Similarly, in the dielectric film, in the respective regions in the proximity of the drain 44e and the source 44b, there are formed two bits 49e and 49b onto which bit information is respectively recorded. Moreover, in the dielectric film, in the respective regions in the proximity of the drain 44d and the source 44c, there are formed two bits 49d and 49c onto which bit information is respectively recorded. Accordingly, in the channel region of a single memory cell, the state of two raised to the power of six (=64), that is to say, information of six bits is recorded.

When reading bit information, a voltage is applied in the direction opposite to writing. At this time, an electric potential between the two voltages applied to the source/drain regions is applied to the gate electrode. For example, in the case of reading the information of bit 49a, 0 (V) is applied to the source 44a, 5 (V) is applied to the drain 44f, and 3 (V) is applied to the gate electrode. Furthermore, the remaining source/drain regions 44b, 44c, 44d, and 44e are in a floating state. As a result, when electric charge is captured electric current does not flow, and when electric charge is not captured electric current flows, and the information of the bit 49a can be read. The bit information is "0" when electric charge (electrons) is present in the bit, and the bit information is "1" when electric charge (electrons) is not present in the bit. FIG. 10 shows an example of the potentials to be applied to the respective electrodes when reading information of the respective bits.

As described above, according to the third embodiment, an information amount that can be stored in a single memory cell can be increased to six bits and a significant cost reduction is possible.

The embodiments of the present invention have been described based on several examples to provide an understanding of the present invention. However, as is obvious to a person skilled in the art, the present invention is not at all limited to these examples and can be modified without departing from the technical idea disclosed in the claims. For example, the number of pairs of diffusion regions (source/drain regions) may be more than three. As a result, integration of the non-volatile memory can be further improved. Moreover, it is possible to configure it with inversed conductivity types of P and N.

The present invention can be applied to improve a degree of integration of a non-volatile memory such as flash memory, the content of which can be electrically erased.

What is claimed is:

1. A non-volatile memory fabricated on a semiconductor substrate, into and from which data can be electrically written and erased, each memory cell of said memory comprising:
    an active region formed on the semiconductor substrate;
    at least one source region formed on the active region;
    at least one drain region formed on the active region, a portion of the active region between the source and drain regions being a channel region;
    a gate electrode formed on the channel region, the gate electrode extending from the channel region in first two directions in a plan view; and
    a gate insulating film formed on the channel region and beneath the gate electrode, wherein
    both said source and drain regions extend in at least three directions from said channel region in the plan view, and every one of said source and drain regions extends from the channel region in a direction different from the first two directions in the plan view.

2. The non-volatile memory according to claim 1, wherein said gate insulating film includes first and second insulating film layers and a dielectric layer formed between the insulating film layers.

3. The non-volatile memory according to claim 2, wherein said first insulating film layer and said second insulating film layer are made from silicon oxide films and said dielectric layer is made from a silicon nitride film.

4. The non-volatile memory according to claim 1, wherein said source and drain regions are formed with two strip-shaped diffusion regions that intersect with each other on said gate electrode formed in a strip shape in the plan view.

5. The non-volatile memory according to claim 2, wherein said source and drain regions are formed with two strip-shaped diffusion regions that intersect with each other on said gate electrode formed in a strip shape in the plan view.

6. The non-volatile memory according to claim 3, wherein said source and drain regions are formed with two strip-shaped diffusion regions that intersect with each other on said gate electrode formed in a strip shape in the plan view.

7. The non-volatile memory according to claim 1, wherein said source and drain regions are formed with three strip-shaped diffusion regions that intersect with each other on said gate electrode formed in a strip shape in the plan view.

8. The non-volatile memory according to claim 2, wherein said source and drain regions are formed with three strip-shaped diffusion regions that intersect with each other on said gate electrode formed in a strip shape in the plan view.

9. The non-volatile memory according to claim 3, wherein said source and drain regions are formed with three strip-shaped diffusion regions that intersect with each other on said gate electrode formed in a strip shape in the plan view.

* * * * *